US005973516A

United States Patent [19]

Bremner et al.

[11] Patent Number: 5,973,516

[45] Date of Patent: Oct. 26, 1999

[54] TRANSIENT SIGNAL DETECTOR WITH TEMPORAL HYSTERESIS

[75] Inventors: Duncan James Bremner, Lochwinnoch, United Kingdom; Ray Allen Reed, San Jose, Calif.

[73] Assignee: National Semiconductor Corporation, Santa Clara, Calif.

[21] Appl. No.: 09/139,011

[22] Filed: Aug. 24, 1998

[51] Int. Cl.$^6$ .................................................... H03K 5/153

[52] U.S. Cl. ................................ 327/74; 327/24; 327/205

[58] Field of Search ................................ 327/24, 68, 71, 327/74, 75, 76, 87, 205, 206

[56] References Cited

U.S. PATENT DOCUMENTS

| | | | |
|---|---|---|---|
| 3,990,048 | 11/1976 | Kanitz et al. | 340/171 R |
| 4,340,854 | 7/1982 | Jones et al. | 324/57 DE |
| 4,854,167 | 8/1989 | Czarnocki et al. | 73/204.19 |
| 5,166,550 | 11/1992 | Matsubara et al. | 327/68 |
| 5,736,826 | 4/1998 | Hrassky | 318/678 |

*Primary Examiner*—Timothy P. Callahan
*Assistant Examiner*—An T. Luu
*Attorney, Agent, or Firm*—Limbach & Limbach L.L.P.

[57] ABSTRACT

A subscriber line interface circuit which includes a transient signal detector with temporal hysteresis. During steady state operation, the drive current for the subscriber loop allows the loop to respond to changes in loop conditions according to a steady state time constant of the loop filter. Upon detection of a line voltage transient which exceeds a predetermined threshold in either a positive or negative direction, the filter time constant is significantly reduced (e.g., 100:1) and held at such reduced value following the initial transient and for a predetermined time period after the line voltage has fallen back below such predetermined threshold. This allows the transient conditions to be fully compensated prior to resetting the filter time constant back from the lower transient value to the higher steady state value.

22 Claims, 2 Drawing Sheets

TIMER
20
21
SW
22
R3
R1
C1
VREF
18
19
16
17
VR+
VR–
25
C2
R2
24
23
gm
12
14
Av
15
Vab
A
B
10

TRANSIENT SIGNAL DETECTOR WITH TEMPORAL HYSTERESIS

BACKGROUND OF THE INVENTION

1. Field of the Invention

The present invention relates to transient signal detectors, and in particular, transient signal detectors for use with subscriber line interface circuits for detecting and compensating transient signals while allowing such transient signals to settle.

2. Description of the Related Art

Many types of circuits require some form of transient signal detection whereby signals within the monitored signal path which exceed some predetermined voltage threshold, and which are frequently transient in nature, can be reliably detected. Rapid and reliable detection of such signals allows such circuits to then either filter out or attempt to compensate or suppress such transient signals.

One such type of circuit is that of a subscriber line interface circuit (SLIC) for telecommunications. Signal transients in a telecommunications environment are quite common. For example, aside from any transient signals introduced by the operating environment (e.g., electrical motors, lightning strikes, ground loops, etc.), transient signals due to transitions between on-hook and off-hook conditions and normal dialing impulses caused by older rotary telephones are often encountered. In many applications such transient signals can cause the circuit operation to become, at best, unreliable and, at worst, fail.

Conventional transient signal detectors generally rely upon the detection of the level, or magnitude, of the transient signal. Typically, when the transient signal magnitude exceeds some predefined threshold, the transient detector indicates the presence of the transient signal, and continues to do so for as long as the transient level remains higher than the threshold. Once the transient signal decreases back below such threshold, the transient detector changes state to indicate that the transient signal has terminated. However, since the threshold value at which the transient detector switches between its positive and negative transient indication states has a non-zero value, even when the transient signal has fallen below such threshold and the transient detector indicates that the transient signal has terminated, the transient signal nonetheless remains, albeit at a reduced level, for some period of time until it actually settles out, or decays, completely. In other words, a positive indication of the presence of a transient signal in a conventional transient signal detector lasts only as long as the transient signal exceeds the predefined threshold, and once the transient signal ceases to exceed such threshold, albeit with some amount of magnitude-dependent hysteresis, it is then identified as having settled when, in fact, some residual amount of transient signal energy remains for some period of time thereafter.

Accordingly, it would be desirable to have a transient signal detector which, notwithstanding a significant reduction in magnitude of the transient signal, maintains a positive indication of the presence of a transient signal for a period of time sufficient to allow the transient signal to more completely settle out.

SUMMARY OF THE INVENTION

A transient signal detector in accordance with the present invention uses both a magnitude detector and a time delay element to maintain a positive indication of a transient signal, thereby allowing the transient signal to settle out more completely before such transient signal becomes identified as having ended.

In accordance with one embodiment of the present invention, a transient signal detector with temporal hysteresis for a subscriber line interface circuit includes a driver circuit, a monitoring circuit and a control circuit. The driver circuit is configured to connect to a subscriber line and receive a drive control signal and in accordance therewith provide to the subscriber line an adjustable line current which varies in relation to the drive control signal. The monitoring circuit is configured to connect to and monitor a voltage on the subscriber line and in accordance therewith provide a monitor signal which varies in relation to the subscriber line voltage. The control circuit is coupled to the monitoring circuit and the driver circuit, and is configured to receive the monitor signal and in accordance therewith provide the drive control signal such that the control circuit provides the drive control signal in accordance with the monitor signal while using: one transfer function following when the monitor signal indicates that the subscriber line voltage has extended outside of a range of voltages defined by upper and lower range limits and for a predetermined time period after the monitor signal indicates that the subscriber line voltage has returned inside of the range of voltages; and another transfer function otherwise.

In accordance with another embodiment of the present invention, a method of detecting and responding with temporal hysteresis to transient signals on a subscriber line includes the steps of:

connecting to a subscriber line;

receiving a drive control signal and in accordance therewith generating in the subscriber line an adjustable line current which varies in relation to the drive control signal;

monitoring a voltage on the subscriber line and in accordance therewith generating a monitor signal which varies in relation to the subscriber line voltage; and generating the drive control signal in accordance with the monitor signal while using one transfer function following when the monitor signal indicates that the subscriber line voltage has extended outside of a range of voltages defined by upper and lower range limits and for a predetermined time period after the monitor signal indicates that the subscriber line voltage has returned inside of the range of voltages, and another transfer function otherwise.

In accordance with still another embodiment of the present invention, a subscriber line interface circuit which includes a transient signal detector with temporal hysteresis includes a transconductance amplifier, a sense amplifier, a subtraction circuit, an adjustable filter and a transient detector. The transconductance amplifier is configured to connect to a subscriber line and receive a drive voltage and in accordance therewith provide to the subscriber line an adjustable line current which varies in relation to the drive voltage. The sense amplifier is configured to connect to and sense a voltage on the subscriber line and in accordance therewith provide a sense signal which varies in relation to the subscriber line voltage. The subtraction circuit is coupled to the sense amplifier and is configured to receive a reference signal and the sense signal and in accordance therewith provide a difference signal which indicates a difference between the reference and sense signals. The adjustable filter includes first and second associated filter time constants, is coupled to the subtraction circuit and the transconductance amplifier, and is configured to receive a control signal with first and second control signal states and in accordance therewith receive and filter the difference signal and in accordance therewith provide the drive voltage such that the difference signal is filtered in accordance with the first and second associated filter time constants when the control signal is in the first and second control signal states, respectively. The transient detector is coupled to the subtraction circuit and the adjustable filter, and is configured to receive the sense signal and in accordance therewith provide the control signal which is: in the first control signal state following when the sense signal indicates that the subscriber line voltage has extended outside of a range of voltages defined by upper and lower range limits and for a predetermined time period after the sense signal indicates that the subscriber line voltage has returned inside of the range of voltages; and in the second control signal state otherwise.

These and other features and advantages of the present invention will be understood upon consideration of the following detailed description of the invention and the accompanying drawings.

DETAILED DESCRIPTION OF THE INVENTION

Figure 1:
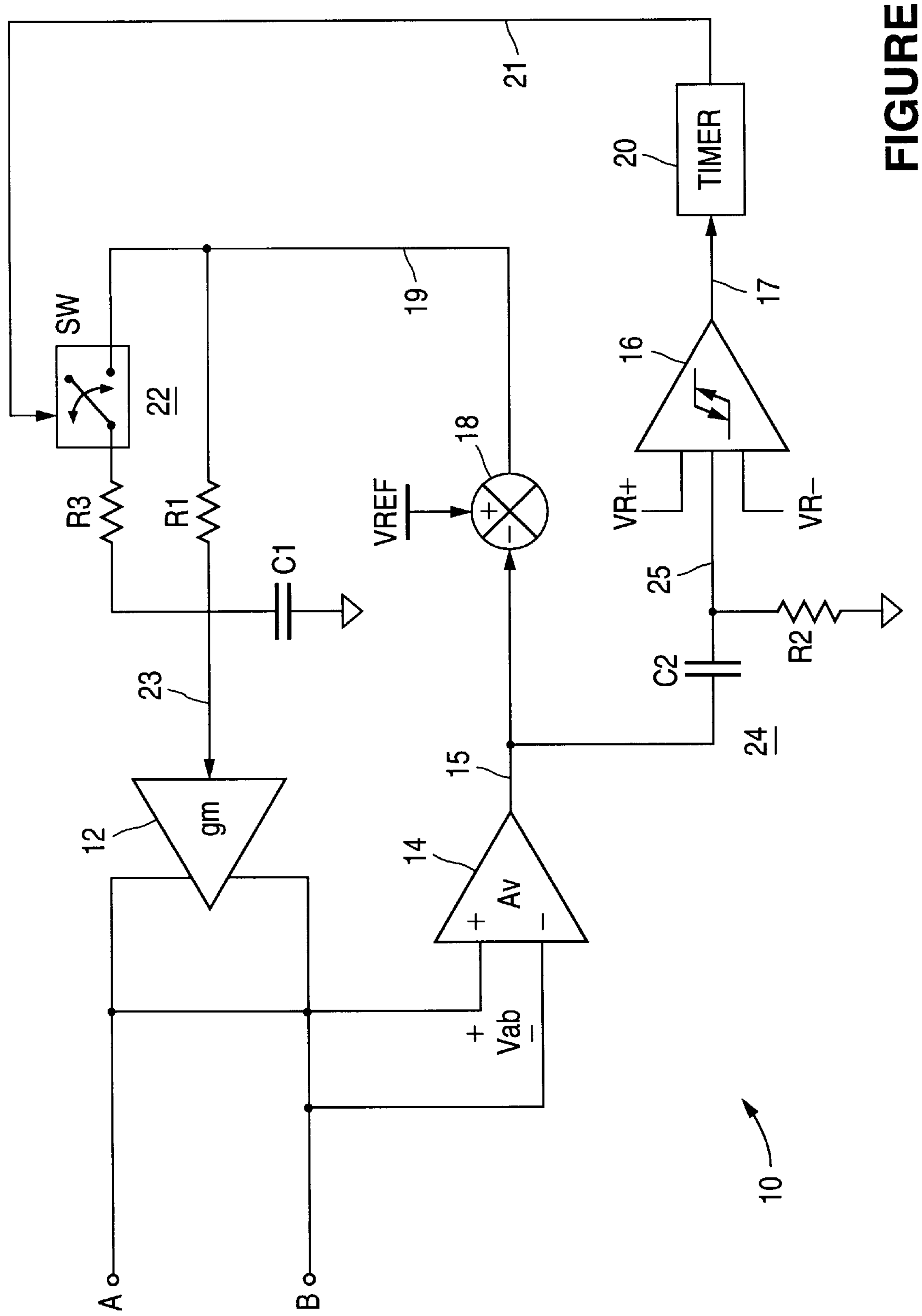
FIG. 1 is a schematic diagram of a transient signal detector with temporal hysteresis in accordance with one embodiment of the present invention.

Referring to FIG. 1, a transient signal detector 10 with temporal hysteresis for a subscriber line interface circuit in accordance with one embodiment of the present invention uses a closed loop circuit topology which includes a transconductance amplifier 12, a sense amplifier 14, a bipolar signal comparator 16, a subtractor 18, a timer circuit 20, a controllable low-pass filter 22 and a high-pass filter 24, all interconnected substantially as shown. Each of these elements individually is well known in the art and can be implemented in accordance with a number of conventional design techniques.

The subscriber wire pair is connected at nodes A and B which, in turn, are connected to a subscriber instrument, such as a telephone (not shown). The transconductance amplifier 12, with a gain of gm, amplifies its single-ended, low-pass filtered input voltage 23 to provide a nominal differential line current to nodes A and B. The resulting differential voltage Vab is monitored by the sense amplifier 14, with a gain of Av, to produce a monitor signal 15 which varies in relation to the subscriber line voltage Vab.

This monitor signal 15 is compared to a reference voltage Vref in the subtractor 18. The resulting comparison signal 19, which represents the difference between the monitor signal 15 and the voltage reference Vref, is low-pass filtered by the low-pass filter 22. In normal, or non-transient, operating mode, the time constant T1 of the low-pass filter 22 is defined by its capacitance C1 and primary resistance R1 (T1=R1*C1). This time constant is normally very high, i.e., the bandwidth of the low-pass filter 22 is normally very low (e.g., 1.5 Hertz) to prevent impacting the voice transmission path in the subscriber loop. When no current is demanded from the subscriber loop, the monitor signal 15 is equal to the voltage reference Vref. As noted above, the resulting low-pass filtered signal 23 drives the transconductance amplifier 12.

The monitor signal 15 is also high-pass filtered by the high-pass filter 24. The time constant T2 of the high-pass filter 24 is defined by its capacitance C2 and resistance R2 (T2=R2*C2). The resulting high-pass filtered signal 25 is compared against two voltage references VR+, VR− in the bipolar comparator 16. When the high-pass filtered signal 25 indicates that the transient level of the subscriber line voltage Vab exceeds a predetermined threshold in either a positive or negative direction, as defined by the positive VR+ and negative VR− reference voltages, respectively, a logic signal 17 is asserted which starts the timer circuit 20. The timer circuit 20 (e.g., a monostable multivibrator) generates a timing control signal 21 which has a predetermined timed duration pulse length, as discussed in more detail below.

This timing control signal 21, when asserted and de-asserted, causes the switch SW in the low-pass filter 22 to close and open, respectively. When the switch SW is closed, the time constant T1 of the low-pass filter 22 is reduced due to the reduced resistance of the combination of resistances R1 and R3 connected in parallel.

During steady-state operation, the loop 10 responds to changes in subscriber loop conditions, as reflected in the subscriber loop voltage Vab, according to the primary time constant T1 (=R1 *C1) of the low-pass filter 22. However, if a rapid change in the subscriber loop voltage Vab is detected, such as that which might occur during off-hook or dial pulse make/break transitions, the transient detector 10 recognizes the fast transition using the high-pass filter 24 and signal comparator 16. This causes the timer circuit 20 to be triggered which, in turn, reduces the loop time constant by connecting the secondary resistance R3 in shunt with the primary resistance R1 of the low-pass filter 22. This reduced loop time constant allows the circuit 10 to react more quickly for compensating, or suppressing, the transient condition in the subscriber loop.

As discussed in more detail below, the effect of using the timer circuit 20 is to maintain the reduced time constant following a substantial decrease from the initial magnitude of the transient, thereby allowing the transient to be brought under control virtually completely before returning the loop to its original, higher time constant. (For example, in one application, this time duration for maintaining the reduced loop time constant is approximately 7 milliseconds after the transient level has been detected as being brought within the non-detect range of the signal comparator 16.) Accordingly, the "hold" time for the reduced loop time constant is "stretched" beyond that of conventional techniques which rely merely upon detection and reaction to the magnitude of the transient signal.

Figure 2:
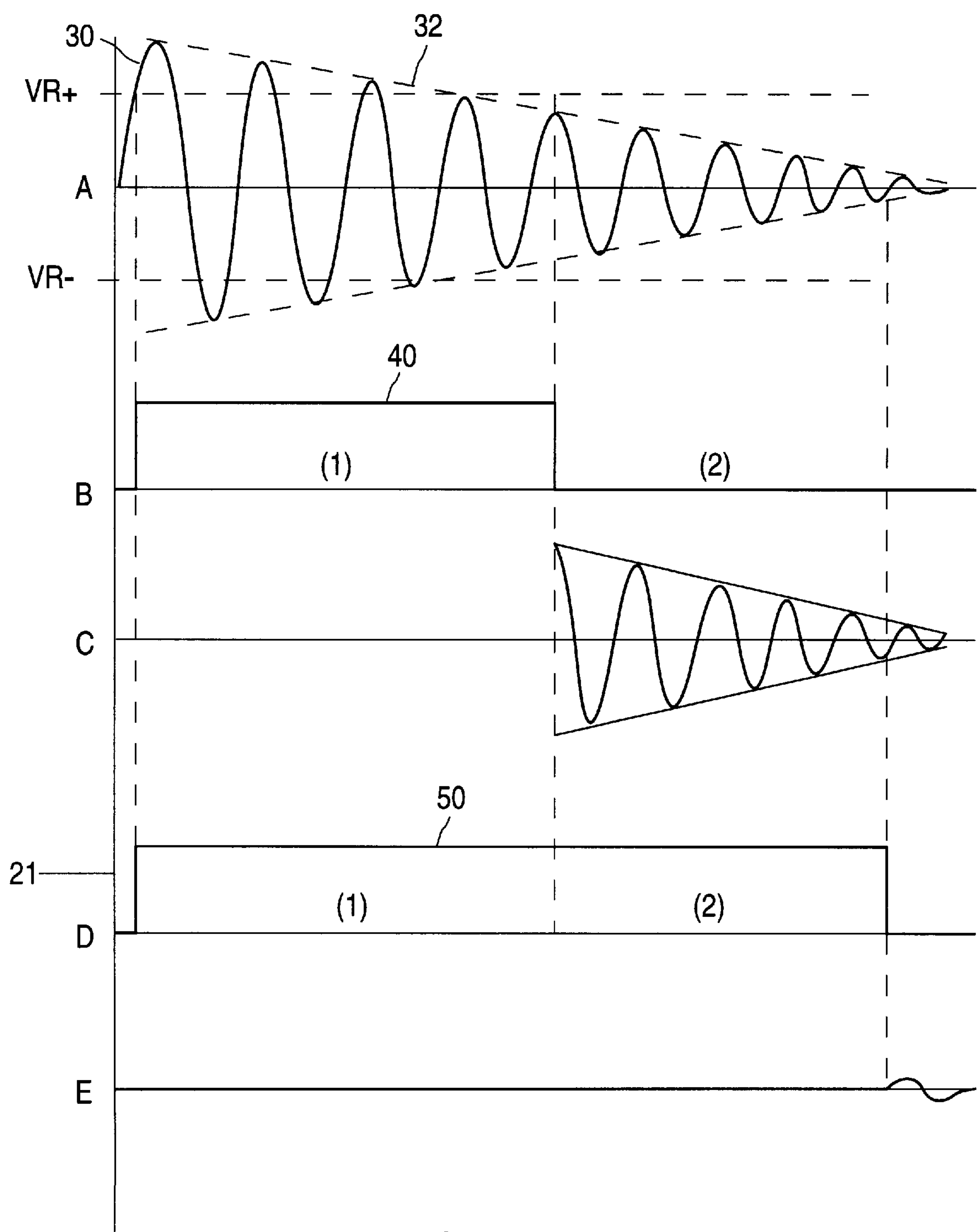
FIG. 2 is a set of signal waveforms and timing diagrams comparing the operation of the circuit of FIG. 1 to a conventional transient signal detector.

Referring to FIG. 2, operation of the circuit 10 of FIG. 1 can perhaps be better understood by discussing its operation in view of a transient signal 30 having a signal envelope 32 as shown in waveform A. As shown in waveform A, the transient signal 30 starts with a peak amplitude and gradually decays, or settles, to zero over time. The successive peaks of the transient signal 30 define a transient signal envelope 32. Waveform B illustrates the asserted state 40 of a conventional transient detector which relies solely on magnitude detection. As is shown, during time period (1), i.e., so long as the peaks of the transient signal 30 extend beyond the positive VR+ and negative VR− thresholds, plus some magnitude-dependent hysteresis, the conventional transient detector provides a positive indication 40 of the presence of the transient signal 30. However, during time period (2), i.e., following when the peaks of the transient signal 30 have returned to within the reference voltage range, the conventional transient signal detector provides a negative indication of the presence of a transient signal, thereby causing transient compensation, or suppression, operations to be terminated. However, such a termination of transient suppression is premature since, as shown in waveform C, a significant amount of transient signal energy remains in the loop.

Referring to waveform D of FIG. 2, a transient signal detector with temporal hysteresis in accordance with the present invention provides a positive indication 50 of the presence of the transient signal for a longer period of time, i.e., through time periods (1) and (2). Accordingly, as shown in waveform E, by the time transient signal suppression operation becomes terminated, the transient signal has settled almost completely, thereby leaving only minimal residual offset within the loop when the primary, lower time constant is reinstated.

Based upon the foregoing, it can be seen that the time-dependent hysteresis of a transient signal detector in accordance with the present invention provides significant transient suppression capability over conventional transient signal detectors which rely solely upon magnitude-dependent hysteresis.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a transient signal detector with temporal hysteresis for a subscriber line interface circuit, comprising:

a driver circuit configured to connect to a subscriber line and receive a drive control signal and in accordance therewith provide to said subscriber line an adjustable line current which varies in relation to said drive control signal;

a monitoring circuit configured to connect to and monitor a voltage on said subscriber line and in accordance therewith provide a monitor signal which varies in relation to said subscriber line voltage; and a control circuit, coupled to said monitoring circuit and said driver circuit, configured to receive said monitor signal and in accordance therewith provide said drive control signal, wherein said control circuit provides said drive control signal in accordance with said monitor signal while using one transfer function following when said monitor signal indicates that said subscriber line voltage has extended outside of a range of voltages defined by upper and lower range limits and for a predetermined time period after said monitor signal indicates that said subscriber line voltage has returned inside of said range of voltages, and another transfer function otherwise.

2. The apparatus of claim 1, wherein said driver circuit comprises a transconductance amplifier configured to receive a voltage signal as said drive control signal and in response thereto generate said adjustable line current.

3. The apparatus of claim 1, wherein said monitoring circuit comprises a differential sense amplifier configured to sense a differential voltage as said monitored subscriber line voltage and in response thereto generate said monitor signal.

4. The apparatus of claim 1, wherein said control circuit comprises:

a controllable filter circuit configured to receive a filter control signal and in accordance therewith filter said monitor signal and in accordance therewith provide said drive control signal; and a control signal generator circuit configured to detect transients in said monitor signal and in accordance therewith provide said filter control signal.

5. The apparatus of claim 4, wherein said controllable filter circuit comprises:

a signal comparison circuit configured to receive and compare a reference signal and said monitor signal and in accordance therewith provide a comparison result signal which indicates a difference between said monitor signal and said reference signal; and an output filter circuit, coupled to said signal comparison circuit, configured to receive said filter control signal and in accordance therewith receive and filter said comparison result signal and in accordance therewith provide said drive control signal.

6. The apparatus of claim 4, wherein said control signal generator circuit comprises:

a transient detection circuit configured to detect said monitor signal transients and in accordance therewith provide a transient detection signal; and a signal comparison circuit, coupled to said transient detection circuit, configured to receive and compare said transient detection signal and at least one reference signal and in accordance therewith provide said filter control signal which is in one signal state following when said transient detection signal indicates that said subscriber line voltage has extended outside of a range of voltages defined by upper and lower range limits and for a predetermined time period after said transient detection signal indicates that said subscriber line voltage has returned inside of said range of voltages, and in another signal state otherwise.

7. The apparatus of claim 6, wherein said transient detection circuit comprises a high-pass filter circuit configured to high-pass filter said monitor signal and in accordance therewith provide said transient detection signal.

8. The apparatus of claim 6, wherein said signal comparison circuit comprises:

a bipolar comparator circuit configured to receive first and second reference signals as said at least one reference signal and to compare said transient detection signal with said first and second reference signals and in accordance therewith provide a comparison result signal; and a timer circuit, coupled to said bipolar comparator circuit, configured to receive said comparison result signal and in accordance therewith provide said filter control signal.

9. A method of detecting and responding with temporal hysteresis to transient signals on a subscriber line, comprising the steps of:

connecting to a subscriber line;

receiving a drive control signal and in accordance therewith generating in said subscriber line an adjustable line current which varies in relation to said drive control signal;

monitoring a voltage on said subscriber line and in accordance therewith generating a monitor signal which varies in relation to said subscriber line voltage; and generating said drive control signal in accordance with said monitor signal while using one transfer function following when said monitor signal indicates that said subscriber line voltage has extended outside of a range of voltages defined by upper and lower range limits and for a predetermined time period after said monitor signal indicates that said subscriber line voltage has returned inside of said range of voltages, and another transfer function otherwise.

10. The method of claim 9, wherein said step of receiving a drive control signal and in accordance therewith generating in said subscriber line an adjustable line current which varies in relation to said drive control signal comprises receiving a voltage signal as said drive control signal and in response thereto generating said adjustable line current.

11. The method of claim 9, wherein said step of monitoring a voltage on said subscriber line and in accordance therewith generating a monitor signal which varies in relation to said subscriber line voltage comprises sensing a differential voltage as said monitored subscriber line voltage and in response thereto generating said monitor signal.

12. The method of claim 9, wherein said step of generating said drive control signal in accordance with said monitor signal while using said one and another transfer functions comprises:

receiving a filter control signal and in accordance therewith filtering said monitor signal and in accordance therewith generating said drive control signal; and detecting transients in said monitor signal and in accordance therewith generating said filter control signal.

13. The method of claim 12, wherein said step of receiving a filter control signal and in accordance therewith filtering said monitor signal and in accordance therewith generating said drive control signal comprises:

receiving and comparing a reference signal and said monitor signal and in accordance therewith generating a comparison result signal which indicates a difference between said monitor signal and said reference signal; and receiving said filter control signal and in accordance therewith filtering said comparison result signal and in accordance therewith generating said drive control signal.

14. The method of claim 12, wherein said step of detecting transients in said monitor signal and in accordance therewith generating said filter control signal comprises:

detecting said monitor signal transients and in accordance therewith generating a transient detection signal; and comparing said transient detection signal and at least one reference signal and in accordance therewith generating said filter control signal which is in one signal state following when said transient detection signal indicates that said subscriber line voltage has extended outside of a range of voltages defined by upper and lower range limits and for a predetermined time period after said transient detection signal indicates that said subscriber line voltage has returned inside of said range of voltages, and in another signal state otherwise.

15. The method of claim 14, wherein said step of detecting said monitor signal transients and in accordance therewith generating a transient detection signal comprises high-pass filtering said monitor signal and in accordance therewith generating said transient detection signal.

16. The method of claim 14, wherein said step of comparing said transient detection signal and at least one reference signal and in accordance therewith generating said filter control signal in said one and another signal states comprises:

receiving first and second reference signals as said at least one reference signal;

comparing said transient detection signal with said first and second reference signals and in accordance therewith generating a comparison result signal; and generating said filter control signal in response to said comparison result signal.

17. An apparatus including a subscriber line interface circuit which includes a transient signal detector with temporal hysteresis, comprising:

a transconductance amplifier configured to connect to a subscriber line and receive a drive voltage and in accordance therewith provide to said subscriber line an adjustable line current which varies in relation to said drive voltage;

a sense amplifier configured to connect to and sense a voltage on said subscriber line and in accordance therewith provide a sense signal which varies in relation to said subscriber line voltage;

a subtraction circuit coupled to said sense amplifier and configured to receive a reference signal and said sense signal and in accordance therewith provide a difference signal which indicates a difference between said reference and sense signals;

an adjustable filter with first and second associated filter time constants, coupled to said subtraction circuit and said transconductance amplifier, and configured to receive a control signal with first and second control signal states and in accordance therewith receive and filter said difference signal and in accordance therewith provide said drive voltage, wherein said difference signal is filtered in accordance with said first and second associated filter time constants when said control signal is in said first and second control signal states, respectively; and a transient detector, coupled to said subtraction circuit and said adjustable filter, configured to receive said sense signal and in accordance therewith provide said control signal which is in said first control signal state following when said sense signal indicates that said subscriber line voltage has extended outside of a range of voltages defined by upper and lower range limits and for a predetermined time period after said sense signal indicates that said subscriber line voltage has returned inside of said range of voltages, and in said second control signal state otherwise.

18. The apparatus of claim 17, wherein said sense amplifier comprises a differential sense amplifier configured to sense a differential voltage as said sensed subscriber line voltage and in response thereto generate said sense signal.

19. The apparatus of claim 17, wherein said adjustable filter comprises an adjustable low-pass filter circuit.

20. The apparatus of claim 17, wherein said transient detector comprises:

a transient filter configured to filter said sense signal and in accordance therewith provide a transient detection signal; and a comparator coupled to said transient filter and configured to receive and compare said transient detection signal and at least one reference signal and in accordance therewith provide said control signal.

21. The apparatus of claim 20, wherein said transient filter comprises a highpass filter circuit.

22. The apparatus of claim 20, wherein said comparator comprises:

a bipolar comparator circuit configured to receive first and second reference signals as said at least one reference signal and to compare said transient detection signal with said first and second reference signals and in accordance therewith provide a comparison result signal; and a timer circuit, coupled to said bipolar comparator circuit, configured to receive said comparison result signal and in accordance therewith provide said control signal.

* * * * *